(12) United States Patent
Schoellkopf

(10) Patent No.: US 7,453,105 B2
(45) Date of Patent: Nov. 18, 2008

(54) INTEGRATED CIRCUIT POWER SUPPLY NETWORK

(75) Inventor: Jean-Pierre Schoellkopf, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 214 days.

(21) Appl. No.: 11/478,857

(22) Filed: Jun. 30, 2006

(65) Prior Publication Data
US 2007/0007629 A1   Jan. 11, 2007

(30) Foreign Application Priority Data
Jul. 5, 2005   (FR) .................... 05 52041

(51) Int. Cl.
H01L 23/52 (2006.01)
(52) U.S. Cl. ............... 257/203; 257/207; 257/E23.151; 257/E23.153
(58) Field of Classification Search ........ 257/278, 257/503, 528, 734, 773, 784, 786, E23.153, 257/203, 207, 211, E27.11, E23.151
See application file for complete search history.

(56) References Cited
U.S. PATENT DOCUMENTS
6,960,793 B2 * 11/2005 Ushiyama ............ 257/207

2001/0045622 A1   11/2001 Iwamoto

OTHER PUBLICATIONS
French Search Report from corresponding French Application No. 0552041, filed Jul. 5, 2005.

* cited by examiner

Primary Examiner—Minh-Loan Tran
Assistant Examiner—William Harriston
(74) Attorney, Agent, or Firm—Lisa K. Jorgenson; James H. Morris; Wolf, Greenfield & Sacks, P.C.

(57) ABSTRACT

An integrated circuit including an assembly of functional blocks and an interconnection network formed of at least N levels of conductive tracks separated by conductive via levels, the interconnection network including a power supply network comprising a first assembly of substantially parallel rails placed at the N-th track level, and a second assembly of substantially parallel rails placed at the (N−1)-th track level under the first rail assembly, the rails of the first assembly being non-parallel to those of the second assembly, the power supply network further including, for each functional block, a third assembly of power supply rails placed at the (N−2)-th track level above the elements of the considered block, and in which the rails of the second assembly form an acute angle smaller than 80° with the rails of each third rail assembly.

6 Claims, 5 Drawing Sheets

INTEGRATED CIRCUIT POWER SUPPLY NETWORK

BACKGROUND OF THE INVENTION

1. Field of the Invention

The present invention relates to an integrated circuit and more specifically to its power supply network.

2. Discussion of the Related Art

FIG. 1 is a simplified view of an integrated circuit 1 conventionally comprising a peripheral ring-shaped assembly 2 formed of input/output blocks. Integrated circuit 1 comprises several functional blocks: a microprocessor 3, a SRAM 4, an amplifier 5, a phase-locked loop circuit PLL 6, and a ROM 7. The functional blocks of circuit 1 are interconnected by an assembly of so-called "global" connections intended to transmit signals between the blocks such as a clock signal which is provided by PLL circuit 6 to each of the other functional blocks. Further, each functional block may be formed of sub-blocks, which are shown in dotted lines in microprocessor 3, interconnected by a set of connections specific to each block. The input/output blocks of peripheral ring-shaped assembly 2 and functional blocks 3 to 7 are connected to ground GND and to a supply voltage VDD by a power supply network, which will be described in further detail hereafter.

Generally, the connections specific to each block, the global inter-block connections, and the power supply network belong to the integrated circuit interconnection network. Such an interconnection network is, in practice, formed of several levels of conductive tracks separated by conductive via levels. Each track or via level corresponds to an assembly of metal tracks or vias placed in openings of an insulating layer. Number N of conductive tracks is variable from one integrated circuit to another. Integrated circuits comprising five or six levels of conductive tracks can frequently be encountered. The connections specific to each block of the integrated circuit are generally formed in the lower track levels, the upper levels being reserved for the placement of a general power supply mesh formed of an assembly of rails partly connected to supply voltage VDD of the circuit and partly connected to ground GND.

FIG. 2 is a simplified view of the power supply mesh of integrated circuit 1 shown in FIG. 1. The power supply mesh comprises an assembly E1 of vertical parallel rails E1, shown by hatchings, and placed at the last track level N of the integrated circuit interconnection network. The mesh further comprises an assembly E2 of horizontal rails placed at the penultimate track level, that is, N−1. Among level E1 of vertical rails, one rail out of two is connected to ground GND and one rail out of two is connected to supply voltage VDD. Similarly, among assembly E2 of horizontal rails, one rail out of two is connected to ground GND and one rail out of two is connected to supply voltage VDD. The rails of assemblies E1 and E2 are connected to one another by an assembly of conductive vias, shown by full disks, and placed at the intersections in top view of a rail of assembly E1 and of a rail of assembly E2. The rails of assemblies E1 and E2 connected to supply voltage VDD are connected to one another and those which are grounded are connected to one another.

To decrease as much as possible the resistivity of the power supply mesh, the tracks of the last and of the penultimate track level are generally provided to be relatively thick, and often thicker than the tracks of the lower levels. Further, the supply rails often are as wide as possible and closely spaced together. It is however sometimes necessary to limit the bulk of the rails of the power supply mesh to be able to slide a few global connections between these rails when the integrated circuit is particularly dense or when a limited number of track levels is available.

The way in which functional blocks 3 to 7 of the integrated circuit are connected to the general power supply mesh is described hereafter in relation with FIGS. 3 and 4.

FIG. 3 is a simplified view of the integrated circuit shown in FIG. 1 in which functional blocks 3 to 7 are shown in dotted lines. Each functional block comprises an assembly of parallel supply rails placed in track level N−2 of the integrated circuit. In this example, the rails of blocks 3, 6, and 7 are vertical and the rails of blocks 4 and 5 are horizontal. For each block, one rail out of two is intended to be connected to ground GND and one rail out of two is intended to be connected to supply voltage VDD of the circuit.

Conventionally, the design of the interconnection network of an integrated circuit, prior to the manufacturing of a set of masks used for the effective manufacturing of the integrated circuit, is performed by means of computer-assisted design tools, according to the following method.

Each functional block is prepared. For this purpose, an assembly of parallel rails is placed on the upper portion of the block in track level N−2 above the block elements. One rail out of two is intended to be connected to supply voltage VDD and one rail out of two is intended to be grounded. The supply rails are then connected to the various elements of the considered block. The connections specific to this block are then routed, that is, the connections connecting the various block elements in track levels 1 to N−3 are placed.

Once all the functional blocks have been thus prepared, the different blocks are placed on the integrated circuit surface. The selection of the location and of the orientation of each block is a function, among others, of its bulk and of its shape. In this example, blocks 3, 6, and 7 are "straight" and blocks 4 and 5 are "rotated", a block being straight or rotated according to whether its supply rails are respectively vertical or horizontal in the considered drawing.

Once the integrated circuit blocks have been positioned, a general power supply mesh, such as that shown in FIG. 2, is placed above the integrated circuit blocks. This general power supply mesh is then connected to the assemblies of supply rails of each of the blocks according to the method described in further detail hereafter.

FIG. 4 is a simplified view of previously-described integrated circuit 1 showing the elements shown in FIG. 3 and in which are shown the assembly of rails E2 of the power supply mesh shown in FIG. 2. The assembly of rails of power supply mesh E2 is formed in track level N−1, that is, just above track level N−2 where the assemblies of the supply rails of block 3 to 7 are placed. For clarity, the assembly of rails E1 placed at the level of tracks N has not been shown. For each of blocks 3 and 7, the assemblies of supply rails are substantially perpendicular to the assembly of rails E2 of the general power supply mesh. In this case, it is possible to easily connect the rails of each block to rail assembly E2 by placing conductive vias at the level of each intersection in top view of a rail of a block and of a rail of assembly E2 both intended to be connected either to ground or to supply voltage VDD.

As concerns "rotated" blocks 4 and 5, complementary vertical rails 41 and 42 are positioned respectively to the left and to the right of block 4 and complementary vertical rails 51 and 52 are placed respectively to the left and to the right of block 5. For each of blocks 4 and 5, horizontal extensions of one supply rail out of two are provided leftwards to reach complementary rails 41 and 51 and horizontal extensions of one supply rail out of two rightwards to reach vertical complementary rails 42 and 52 are provided. Complementary vertical rails 41, 42, 51, 52 are then connected to rail assembly E2 of the general power supply mesh by the placing of vias at the intersections in top view between a complementary vertical rail and a rail of assembly E2 both intended to be either grounded or connected to supply voltage VDD.

As visible in FIG. 4, the non-rotated functional blocks are connected by a large number of vias to the general power supply mesh while the rotated blocks are connected by a limited number of conductive vias to the general power supply mesh. Further, rotated blocks 4 and 5 are connected to the general power supply mesh by their ends, which results in significantly increasing the resistance of the power supply network at the level of each of the rotated blocks.

SUMMARY OF THE INVENTION

An object of the present invention is to provide an integrated circuit which comprises a lightly resistive power supply network whatever the considered block, rotated or not.

Another object of the present invention is to provide such an integrated circuit having a simple structure.

To achieve these and other objects, the present invention provides an integrated circuit comprising an assembly of functional blocks and an interconnection network formed of at least N levels of conductive tracks separated by conductive via levels, the interconnection network comprising a power supply network comprising a first assembly of substantially parallel rails placed at the N-th track level, and a second assembly of substantially parallel rails placed at the (N-1)-th track level under the first rail assembly, the rails of the first assembly being non-parallel to those of the second assembly, the power supply network further comprising, for each functional block, a third assembly of power supply rails placed at the (N-2)-th track level above the elements of the considered block, and in which the rails of the second assembly form an acute angle smaller than 80° with the rails of each third rail assembly.

According to a variation of the previously-described circuit, said acute angle is substantially equal to 450.

According to a variation of the previously-described circuit, said acute angle ranges between 30 and 60°.

According to a variation of the above-mentioned circuit, said first and second rail assemblies are substantially perpendicular to each other.

According to a variation of the previously-described circuit, for each of the first, second, and third rail assemblies, one rail out of two is connected to ground and one rail out of two is connected to a supply voltage.

According to a variation of the previously-described circuit, an assembly of conductive vias is used to connect the third rails assemblies of each of the blocks to said second rail assembly and the second rail assembly to the first rail assembly.

According to a variation of the previously-described circuit, the interconnection network further comprises inter-block connections placed between said first and second rail assemblies.

The foregoing and other objects, features, and advantages of the present invention will be discussed in detail in the following non-limiting description of specific embodiments in connection with the accompanying drawings.

DETAILED DESCRIPTION

Figure 1:
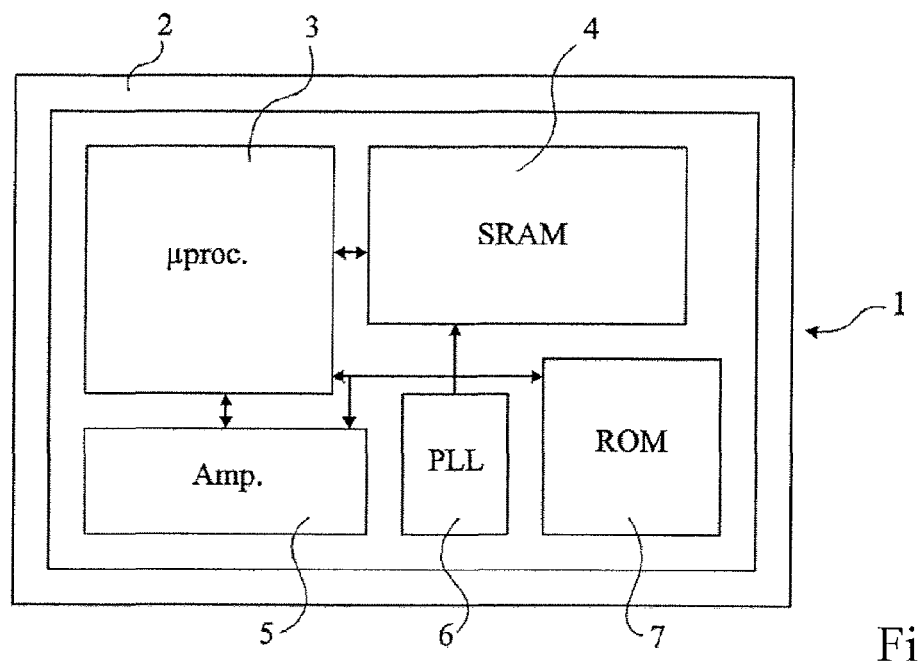
FIG. 1 is a simplified view, previously described, of an integrated circuit.

For clarity, the same elements have been designated with the same reference numerals in the different drawings and, further, as usual in the representation of integrated circuits, the various drawings are not to scale.

Figure 2:
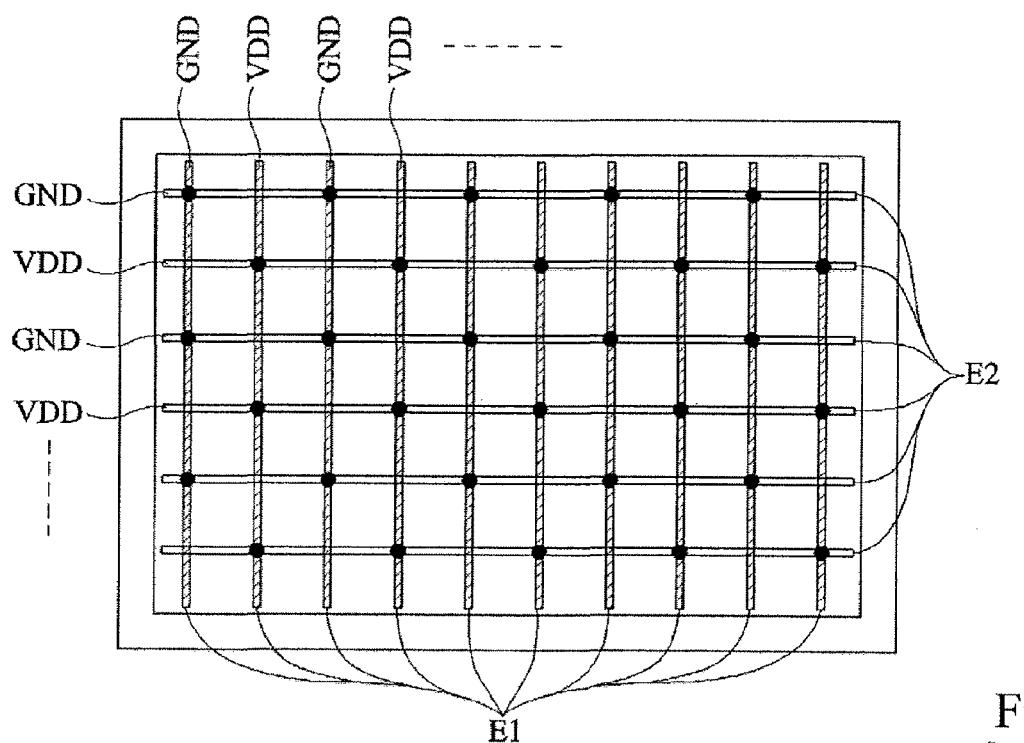
FIG. 2 is a simplified view of the general power supply mesh of the integrated circuit shown in FIG. 1.

An integrated circuit according to the present invention comprises a general power supply mesh, formed in the last two track levels of its interconnection network, which is rotated with respect to the general power supply mesh of a conventional integrated circuit shown in FIG. 2.

Figure 5:
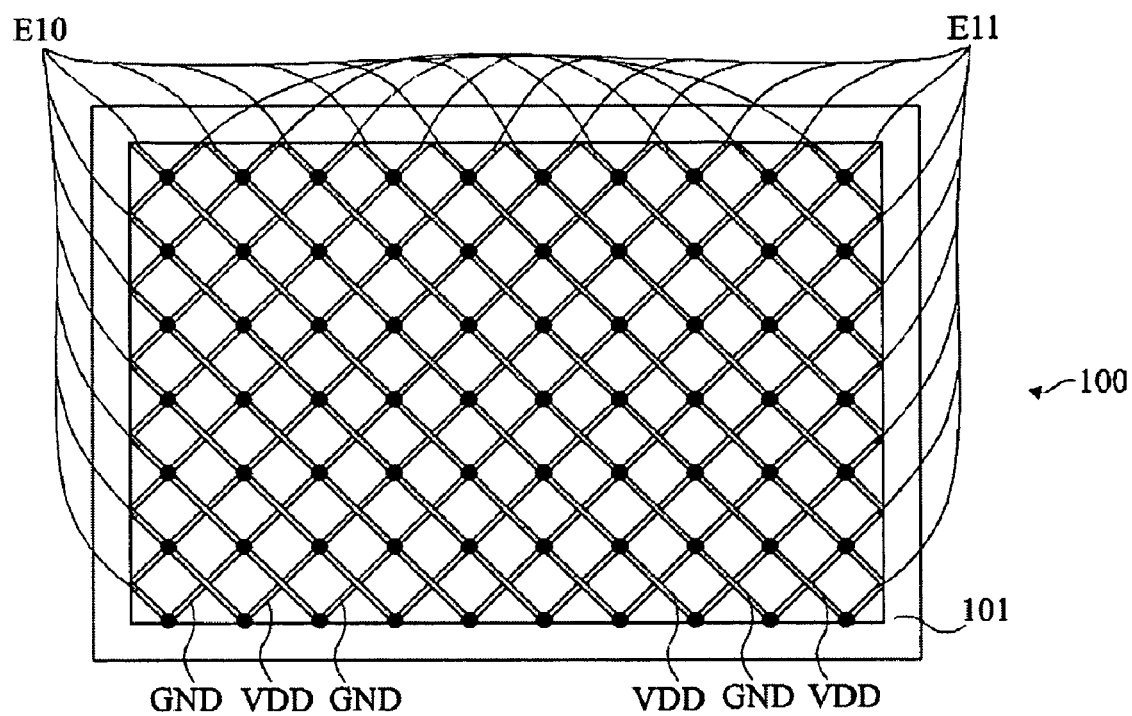
FIG. 5 is a simplified view of an integrated circuit according to the present invention illustrating its general power supply mesh.

FIG. 5 is a diagram of an integrated circuit 100 according to the present invention comprising a "rotated" general power supply mesh. Integrated circuit 100 has, in this example, a substantially rectangular shape. Integrated circuit 100 comprises a peripheral ring-shaped assembly 101 of input/output devices and a general power supply mesh formed in the last and in the penultimate track level of the integrated circuit. The general power supply mesh comprises an assembly of parallel rails E10, shown by hatchings, which are placed in the last track level N of the interconnection network of the integrated circuit, as well as an assembly of parallel rails E11 placed in the penultimate track level N-1. In this example of embodiment, the rails of assembly E10 are substantially perpendicular to the rails of assembly E11. The rails of assembly E10 are rotated leftwards and the rails of assembly E11 are rotated rightwards to form an acute angle substantially equal to 45° with the lower or upper horizontal edge of the integrated circuit. One rail out of two of assembly E10 is intended to be connected to ground GND and the other rails are intended to be connected to a supply voltage VDD. Similarly, one rail out of two of assembly E11 is intended to be connected to ground GND and the other rails are intended to be connected to supply voltage VDD. Conductive vias, shown by full disks, are placed at each apparent intersection in top view of a rail of assembly E10 and of a rail of assembly E11 intended to be both connected either to ground GND or to supply voltage VDD.

Figure 3:
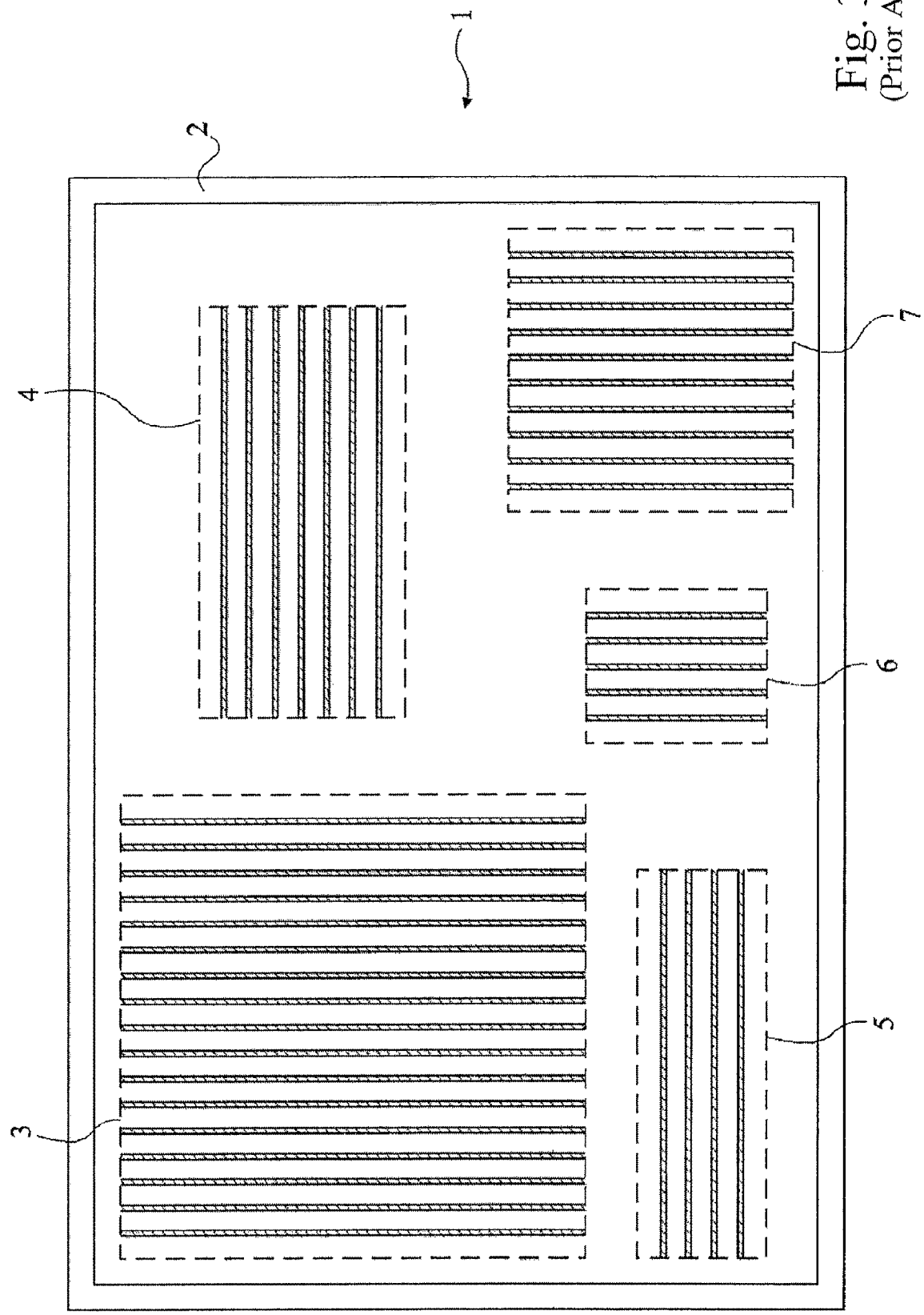
FIG. 3 is a simplified view of the integrated circuit shown in FIG. 1 illustrating the portion of the power supply network specific to each circuit block.
Figure 6:
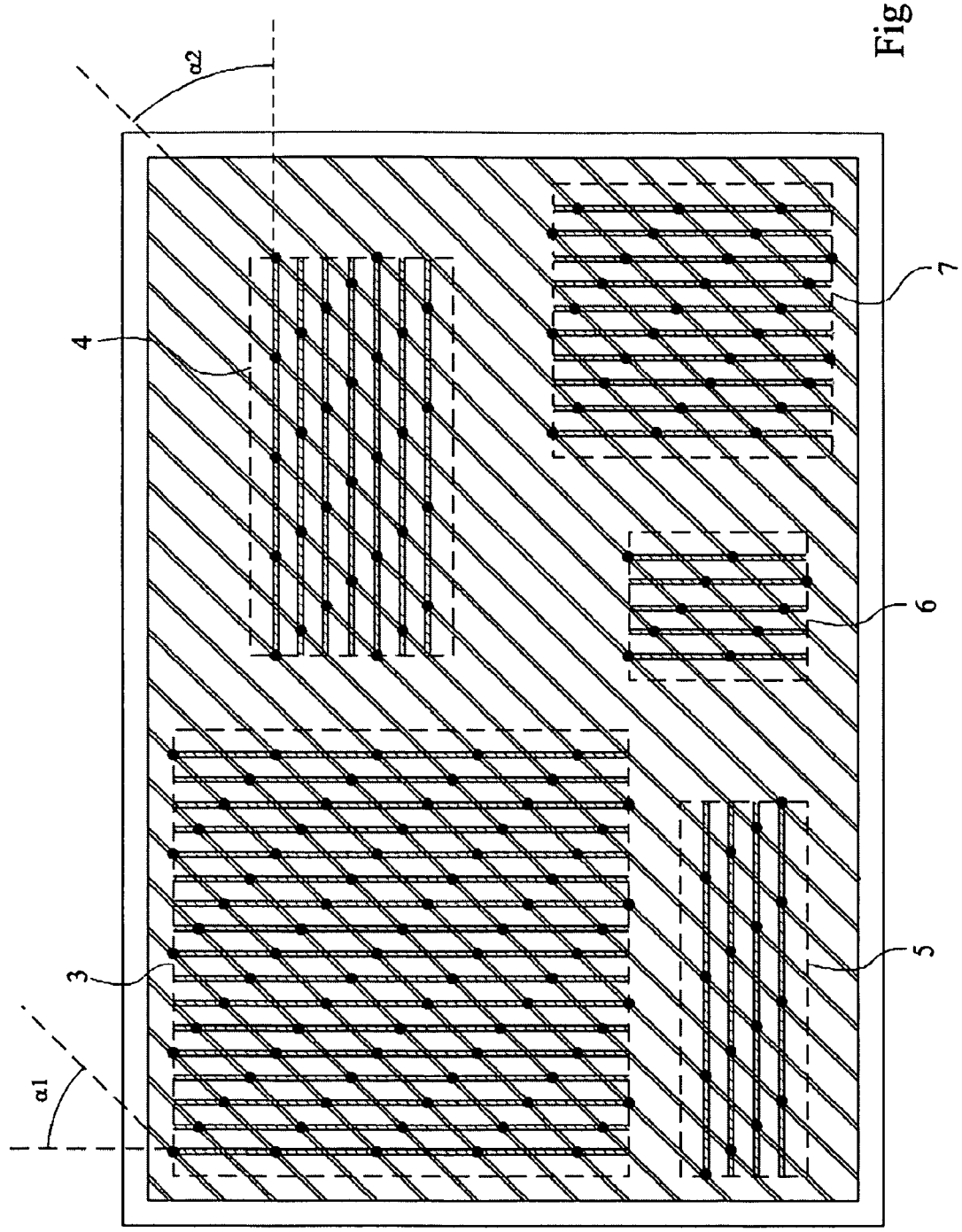
FIG. 6 is a simplified view of an integrated circuit according to the present invention illustrating the connections between the general power supply mesh of the circuit and the portions of the power supply network specific to each block.

FIG. 6 is a simplified view of integrated circuit 100 according to the present invention shown in FIG. 2. Circuit 100 comprises the same functional blocks as those of integrated circuit 1 shown in FIG. 3. Although they belong to different circuits, the blocks of integrated circuit 100 are in the following description designated with reference numerals identical to those of previously-described circuit 1. As described previously in relation with FIG. 3, each block comprises an assembly of substantially parallel supply rails placed in track level N-3. Blocks 3, 6, and 7 are placed straight and blocks 4 and 5 are rotated. Supply rail assembly E11 of the power supply mesh is shown in FIG. 6. For clarity, supply rail assembly E10 of the power supply mesh is not shown. The supply rails of each block and those of assembly E11 intended to be grounded are connected to one another by conductive vias positioned at the apparent intersections in top view between these rails. Similarly, the supply rails of each block and those of assembly E11 intended to be connected to supply voltage VDD are connected to one another by conductive vias positioned at the apparent intersections in top view between these rails.

As visible from FIG. 6, whatever the orientation of the integrated circuit blocks, that is, rotated or not, there is a large number of conductive vias of connection between the supply rails of a block and the general power supply mesh rails. Conversely to the circuit shown in FIG. 4, it is not necessary to provide complementary rails at the ends of the rotated blocks to be able to place connection vias.

Figure 4:
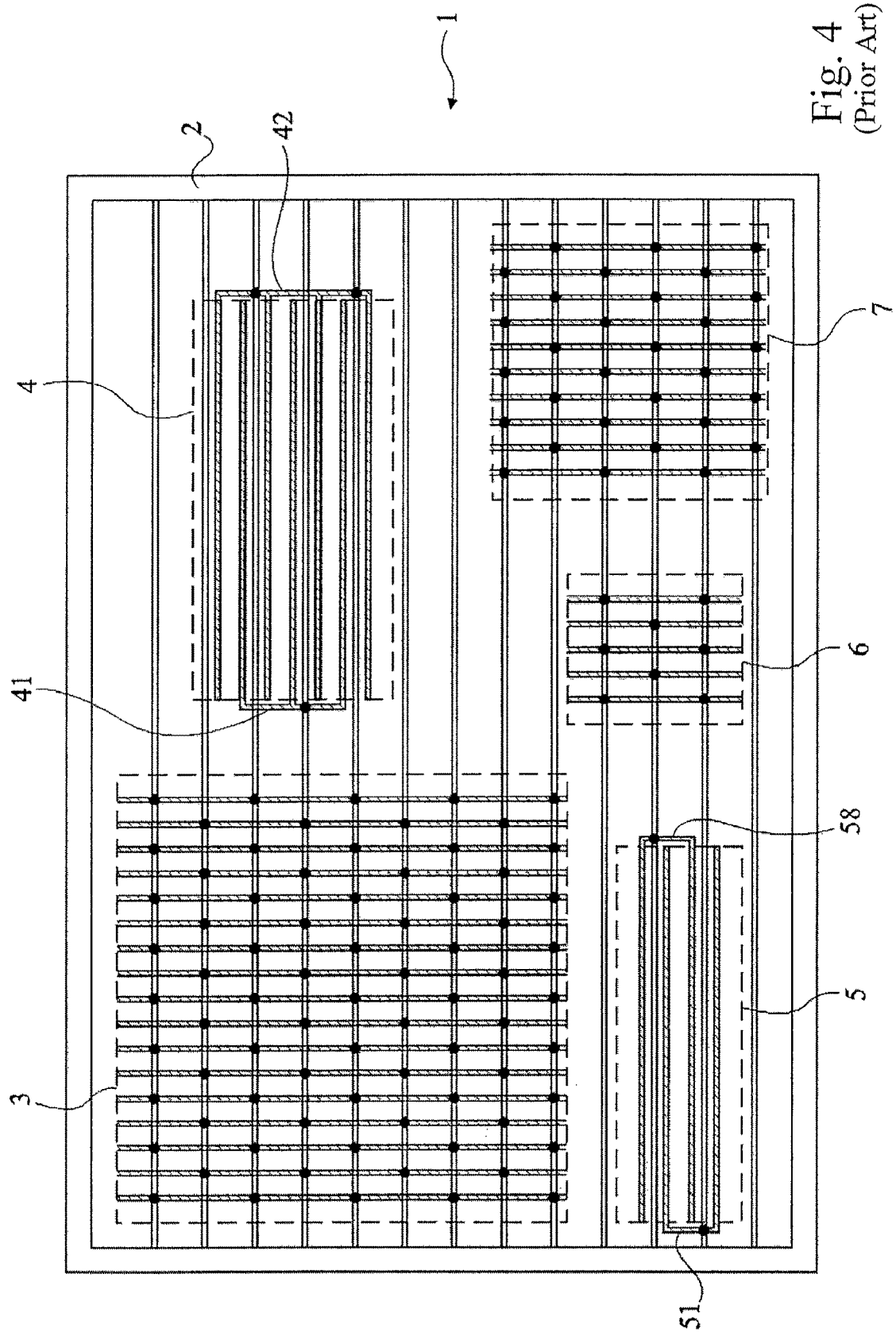
FIG. 4 is a simplified view of the integrated circuit shown in FIGS. 1 to 3 illustrating the connections between the general power supply mesh of the circuit and the portions of the power supply network specific to each block.

Further, by comparing the number of conductive connection vias which are placed above each of the blocks in circuit 1 previously described in relation with FIG. 4 and in circuit 100 according to the present invention shown in FIG. 6, the number of vias appears to be substantially identical for non-rotated blocks 3, 6, and 7 and much greater for rotated blocks 4 and 5. Since the supply rails of each block are connected to the general power supply mesh by a large number of conductive vias placed regularly above each block, the supply network is lightly resistive, whatever the considered block.

As visible in FIG. 6, a supply rail of a non-rotated block, such as block 3, "crosses" in top view at least one rail of assembly E11, by forming therewith an acute angle called $\alpha1$. Similarly, a rail of a rotated block, such as block 4, crosses in top view at least one rail of assembly E11 by forming therewith an acute angle $\alpha2$. It should be noted that the sum of angles $\alpha1$ and $\alpha2$ is equal to 90°.

As shown in FIG. 6, with angles $\alpha1$ and $\alpha2$ equal to 45°, a very good power supply network is obtained for each of the blocks, be they or not rotated. However, angles $\alpha1$ and $\alpha2$ ranging between 30 and 60° may be selected in the case, for example, where such an orientation enables a more optimal routing of global inter-block connections in the last and penultimate track levels of the integrated circuit. At all events, it is enough for angles $\alpha1$ and $\alpha2$ to be lower than an 80 or 85° value so that in top view, crossings between the supply rails of each block and the general supply mesh are obtained, at the level of which connection vias can be placed.

Of course, the present invention is likely to have various alterations, modifications, and improvements which will readily occur to those skilled in the art. In particular, it is possible for rail assemblies E10 and E11 of the general power supply mesh not to be perpendicular to one another. A rail of assembly E10 and a rail of assembly E11 may be inclined with respect to each other by forming an acute angle smaller than 45°.

Further, the general power supply mesh of an integrated circuit according to the present invention may be partially cut to place in this cutting elements of one of the integrated circuit blocks such as a coil. It may also be provided to place devices above the power supply mesh possibly on one or several other track levels.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising an assembly of functional blocks and an interconnection network formed of at least N levels of conductive tracks separated by conductive via levels, the interconnection network comprising a power supply network comprising:
   a first assembly of substantially parallel rails placed at the N-th track level,
   a second assembly of substantially parallel rails placed at the (N−1)-th track level under the first rail assembly, the rails of the first assembly being substantially perpendicular to those of the second assembly,
   for each functional block, a third assembly of power supply rails placed at the (N−2)-th track level above the elements of the considered block, wherein the rails of the second assembly form an acute angle smaller than 80° with the rails of each third rail assembly.

2. The circuit of claim 1, wherein said acute angle is substantially equal to 45°.

3. The circuit of claim 1, wherein said acute angle ranges between 30 and 60°.

4. The circuit of claim 1, wherein for each of the first, second, and third rail assemblies, one rail out of two is connected to ground and one rail out of two is connected to a supply voltage.

5. The circuit of claim 1, wherein an assembly of conductive vias is used to connected the third rail assemblies of each of the blocks to said second rail assembly and the second rail assembly to the first rail assembly.

6. The circuit of claim 1, wherein the interconnection network further comprises inter-block connections placed between said first and second rail assemblies.

* * * * *

UNITED STATES PATENT AND TRADEMARK OFFICE
CERTIFICATE OF CORRECTION

PATENT NO. : 7,453,105 B2
APPLICATION NO. : 11/478857
DATED : November 18, 2008
INVENTOR(S) : Jean-Pierre Schoellkopf It is certified that error appears in the above-identified patent and that said Letters Patent is hereby corrected as shown below:

Col. 3, line 39, should read:
cuit, said acute angle is substantially equal to 45°.

Signed and Sealed this

Sixth Day of January, 2009

JON W. DUDAS
*Director of the United States Patent and Trademark Office*